United States Patent
Aoyama et al.

(10) Patent No.: US 8,618,568 B2
(45) Date of Patent: Dec. 31, 2013

(54) METHOD FOR MANUFACTURING LIGHT-EMITTING DEVICE AND FILM FORMATION SUBSTRATE

(75) Inventors: Tomoya Aoyama, Kanagawa (JP); Kohei Yokoyama, Kanagawa (JP); Rena Tsuruoka, Hyogo (JP); Hideki Uchida, Chiba (JP); Toru Sonoda, Nara (JP); Satoshi Inoue, Nara (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 10 days.

(21) Appl. No.: 13/259,378

(22) PCT Filed: Apr. 8, 2010

(86) PCT No.: PCT/JP2010/056719
§ 371 (c)(1),
(2), (4) Date: Sep. 23, 2011

(87) PCT Pub. No.: WO2010/122937
PCT Pub. Date: Oct. 28, 2010

(65) Prior Publication Data
US 2012/0012883 A1   Jan. 19, 2012

(30) Foreign Application Priority Data
Apr. 22, 2009  (JP) ................. 2009-103896

(51) Int. Cl.
*H01L 33/00* (2010.01)

(52) U.S. Cl.
USPC ........... 257/98; 257/99; 257/40; 257/88; 257/89; 257/79; 438/149; 438/166; 438/487; 438/27; 438/618; 369/100; 369/1; 428/64.4

(58) Field of Classification Search
USPC .......... 257/98, 99, 40, 88, 89, 79; 438/149, 438/166, 487, 27, 618, 710; 369/100, 1; 428/64.4
See application file for complete search history.

(56) References Cited

U.S. PATENT DOCUMENTS 4,752,455 A * 6/1988 Mayer ................... 427/597
5,851,709 A * 12/1998 Grande et al. .............. 430/7
(Continued)

FOREIGN PATENT DOCUMENTS

| CN | 1769066 | 5/2006 |
| CN | 101615658 | 12/2009 |

(Continued)

OTHER PUBLICATIONS

International Search Report for WO application PCT/JP2010/056719, mailing date Jul. 6, 2010.
(Continued)

Primary Examiner — Fernando L Toledo
Assistant Examiner — Mohammed Shamsuzzaman
(74) Attorney, Agent, or Firm — Husch Blackwell LLP

(57) ABSTRACT

In a method for manufacturing a light-emitting device according to an embodiment of the present invention, one surface of a first substrate including a reflective layer including an opening, a light absorption layer formed over the reflective layer to cover the opening in the reflective layer, a protective layer formed over the light absorption layer and including a groove at a position overlapped with the opening in the reflective layer, and a material layer formed over the protective layer and a deposition surface of a second substrate are disposed to face each other and light irradiation is performed from the other surface side of the first substrate, so that an EL layer is formed in a region on the deposition surface of the second substrate, which is overlapped with the opening in the reflective layer.

9 Claims, 8 Drawing Sheets

(56) References Cited

U.S. PATENT DOCUMENTS

| | | | |
|---|---|---|---|
| 6,307,317 B1* | 10/2001 | Codama et al. | 313/504 |
| 6,628,355 B1* | 9/2003 | Takahara | 349/106 |
| 6,706,360 B2* | 3/2004 | Inoue et al. | 428/64.1 |
| 6,785,447 B2* | 8/2004 | Yoshimura et al. | 385/42 |
| 7,141,821 B1* | 11/2006 | Yamazaki et al. | 257/69 |
| 7,390,684 B2* | 6/2008 | Izuno et al. | 438/29 |
| 7,399,993 B2* | 7/2008 | Matsuda | 257/89 |
| 7,426,174 B2* | 9/2008 | Terao et al. | 369/276 |
| 7,439,171 B2* | 10/2008 | Soda et al. | 438/618 |
| 7,449,279 B2* | 11/2008 | Yashiro et al. | 430/270.16 |
| 7,488,701 B2* | 2/2009 | Mizukami et al. | 503/201 |
| 7,691,783 B2* | 4/2010 | Matsuda et al. | 503/227 |
| 7,726,013 B2* | 6/2010 | Kimura | 29/832 |
| 7,887,987 B2* | 2/2011 | Matsuo | 430/200 |
| 7,981,494 B2* | 7/2011 | Kodaira et al. | 428/64.1 |
| 8,182,863 B2* | 5/2012 | Yamazaki et al. | 427/66 |
| 8,329,481 B2* | 12/2012 | Miyachi | 438/27 |
| 2002/0127367 A1* | 9/2002 | Shibata | 428/64.4 |
| 2003/0013280 A1* | 1/2003 | Yamanaka | 438/487 |
| 2003/0218941 A1* | 11/2003 | Terao et al. | 369/13.01 |
| 2004/0115849 A1* | 6/2004 | Iwafuchi et al. | 438/25 |
| 2004/0175843 A1* | 9/2004 | Roitman et al. | 436/531 |
| 2004/0223315 A1* | 11/2004 | Suehiro et al. | 362/84 |
| 2004/0245924 A1* | 12/2004 | Utsunomiya et al. | 313/506 |
| 2005/0088921 A1* | 4/2005 | Terao et al. | 369/13.01 |
| 2005/0127820 A1* | 6/2005 | Yamazaki et al. | 313/501 |
| 2006/0084006 A1 | 4/2006 | Kang et al. | |
| 2006/0174256 A1* | 8/2006 | Yashiro et al. | 720/718 |
| 2006/0202211 A1* | 9/2006 | Ueda et al. | 257/79 |
| 2006/0246240 A1* | 11/2006 | Matsuda et al. | 428/32.39 |
| 2007/0001236 A1* | 1/2007 | Yamazaki et al. | 257/79 |
| 2007/0057264 A1* | 3/2007 | Matsuda | 257/88 |
| 2007/0087492 A1* | 4/2007 | Yamanaka | 438/166 |
| 2007/0252155 A1* | 11/2007 | Cok | 257/79 |
| 2007/0262335 A1* | 11/2007 | Kumei et al. | 257/98 |
| 2008/0012471 A1* | 1/2008 | Cok | 313/503 |
| 2008/0035835 A1* | 2/2008 | Komatsu et al. | 250/208.1 |
| 2008/0037402 A1* | 2/2008 | Sugiura et al. | 369/275.1 |
| 2008/0057632 A1* | 3/2008 | Arai et al. | 438/149 |
| 2008/0087629 A1* | 4/2008 | Shimomura et al. | 216/11 |
| 2008/0113292 A1* | 5/2008 | Matsuo | 430/270.1 |
| 2008/0157654 A1* | 7/2008 | Cok | 313/504 |
| 2008/0159100 A1* | 7/2008 | Hirotsune et al. | 369/53.17 |
| 2008/0206848 A1* | 8/2008 | Hagiwara et al. | 435/287.2 |
| 2008/0260984 A1* | 10/2008 | Kodaira et al. | 428/64.4 |
| 2008/0284323 A1* | 11/2008 | Kashiwabara et al. | 313/504 |
| 2009/0103292 A1* | 4/2009 | Iwafuchi et al. | 362/227 |
| 2009/0104835 A1* | 4/2009 | Aoyama et al. | 445/58 |
| 2009/0128904 A1* | 5/2009 | Uejima et al. | 359/486 |
| 2009/0142510 A1* | 6/2009 | Takahashi et al. | 427/557 |
| 2009/0184636 A1* | 7/2009 | Cok | 313/505 |
| 2009/0256169 A1* | 10/2009 | Yokoyama et al. | 257/98 |
| 2009/0325451 A1 | 12/2009 | Higo et al. | |
| 2010/0084676 A1* | 4/2010 | Tanaka | 257/98 |
| 2010/0099268 A1* | 4/2010 | Timans | 438/761 |
| 2010/0118680 A1* | 5/2010 | Yashiro et al. | 369/100 |
| 2010/0239789 A1* | 9/2010 | Umeda | 428/1.33 |
| 2010/0246363 A1* | 9/2010 | Yashiro et al. | 369/100 |
| 2010/0304570 A1* | 12/2010 | Horie et al. | 438/710 |
| 2010/0327734 A1* | 12/2010 | Hiramatsu | 313/503 |
| 2011/0027616 A1* | 2/2011 | Kashiwabara et al. | 428/690 |
| 2011/0062479 A1* | 3/2011 | Sugano et al. | 257/98 |
| 2011/0089412 A1* | 4/2011 | Fujimori et al. | 257/40 |
| 2012/0088324 A1* | 4/2012 | Yokoyama et al. | 438/29 |
| 2012/0228662 A1* | 9/2012 | Hayashi | 257/99 |
| 2012/0298973 A1* | 11/2012 | Adachi et al. | 257/40 |

FOREIGN PATENT DOCUMENTS

| | | |
|---|---|---|
| EP | 1 650 046 A1 | 4/2006 |
| JP | 2006-123546 | 5/2006 |
| JP | 2006-309995 | 11/2006 |
| JP | 2008-66147 | 3/2008 |
| JP | 2009-123692 | 6/2009 |
| JP | 2009-152187 | 7/2009 |
| JP | 2010-34022 | 2/2010 |
| KR | 10-2006-0034575 | 4/2006 |
| KR | 10-2009-0056920 | 6/2009 |

OTHER PUBLICATIONS

Written Opinion of the International Searching Authority for WO application PCT/JP2010/056719, mailing date Jul. 6, 2010.

* cited by examiner

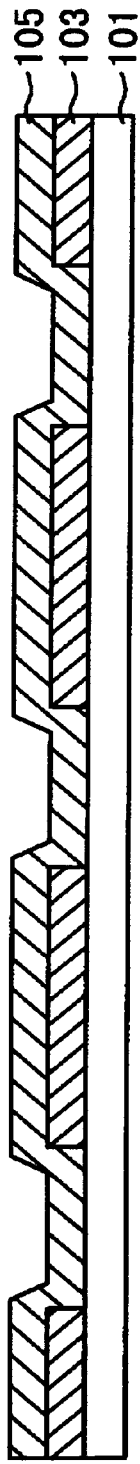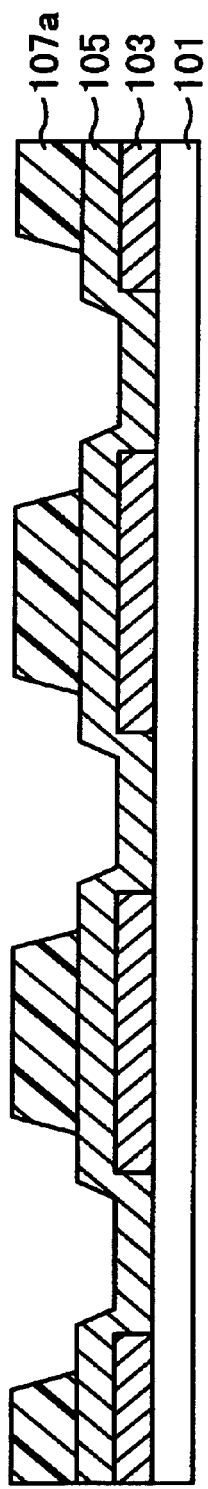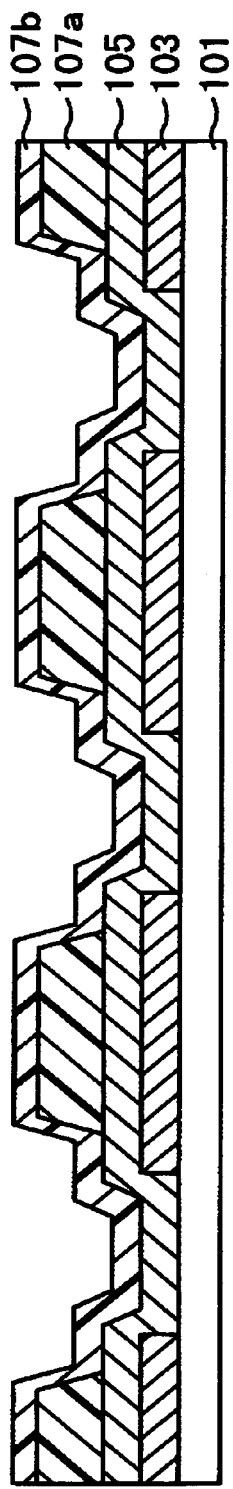

METHOD FOR MANUFACTURING LIGHT-EMITTING DEVICE AND FILM FORMATION SUBSTRATE

TECHNICAL FIELD

The present invention relates to a light-emitting device and a method for manufacturing the light-emitting device. The present invention also relates to a film formation substrate used for film formation of a material which can be deposited onto a substrate.

BACKGROUND ART

An organic compound can take a wider variety of structures compared with an inorganic compound, and it is possible to synthesize a material having a variety of functions by appropriate molecular-design of an organic compound. Owing to these advantages, photo electronics and electronics which use a functional organic material have been attracting attention in recent years.

Examples of electronic devices in which organic compounds are used as functional organic materials include solar cells, light-emitting elements, organic transistors, and the like. These are devices taking advantage of electric properties and optical properties of the organic compound. Among them, in particular, a light-emitting element has been making remarkable development.

It is said that light-emitting elements have a mechanism of light emission as follows: by applying voltage between a pair of electrodes with an electroluminescence (hereinafter also referred to as EL) layer interposed therebetween, electrons injected from a cathode and holes injected from an anode recombine with each other in an emission center of the EL layer to form molecular excitons, and energy is released when the molecular excitons relax to the ground state; accordingly light is emitted. Singlet excitation and triplet excitation are known as excited states, and it is considered that light emission can be obtained through either of the excited states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

EL materials for forming an EL layer are broadly classified into a low molecular (monomer) material and a high molecular (polymer) material. In general, a low molecular material is often formed using an evaporation apparatus and a high molecular material is often formed using an ink-jet method or the like. A conventional evaporation apparatus, in which a substrate is mounted in a substrate holder, has a crucible (or an evaporation boat) containing an EL material, i.e., an evaporation material; a heater for heating the EL material in the crucible; and a shutter for preventing the EL material from being scattered during sublimation. The EL material heated with the heater is sublimed and formed over the substrate. In order to achieve uniform film formation, a deposition substrate needs to be rotated and the distance between the substrate and the crucible needs to be about 1 m even when the substrate has a size of 300 mm×360 mm.

In the case of considering manufacturing a full-color flat panel display using emission colors of red, green, and blue by the above method, a metal mask is provided between the substrate and an evaporation source so as to be in contact with the substrate, so that selective coloring can be achieved using this mask. However, this method does not provide very high-precision film formation and thus requires that the distance between pixels be designed to be large and that the width of a partition (a bank) formed of an insulator between pixels be large. Therefore, application of the method to a high-definition display device is difficult.

In addition, demands for more definition, higher aperture ratio, and higher reliability of a full-color flat panel display using emission colors of red, green, and blue have been increasing. Such demands are big objects in advancing higher definition (increase in the number of pixels) of a light-emitting device and miniaturization of each display pixel pitch with reduction in the size of the light-emitting device. At the same time, demands for improvement in productivity and cost reduction are increasing.

Thus, a method for forming an EL layer of a light-emitting element by laser thermal transfer has been proposed. Specifically, a transfer substrate is manufactured in which a metal layer including a high reflective layer and a low reflective layer (a light absorption layer) each for laser light is formed on a surface or rear surface of a supporting substrate and a material layer (an EL layer) for a light-emitting layer or the like is formed on the metal layer. After that, laser irradiation is performed from the rear surface side of the transfer substrate. The laser light is reflected by the high reflective layer and is absorbed by the low reflective layer and converted into heat, so that a material layer (an EL layer) over the low reflective layer is transferred (see Patent Document 1).

In Patent Document 1, heat which is converted from light in a light absorption layer is conducted not only in a film thickness direction but also in a film surface direction. When heat is conducted in a film surface direction, a heated region of the material layer is enlarged. As a result, the EL layer which is a transfer layer transferred to a deposition substrate is enlarged at the same time.

REFERENCE

Patent Document

[Patent Document 1] Japanese Published Patent Application No. 2006-309995

DISCLOSURE OF INVENTION

It is an object of an embodiment of the present invention to provide a method for manufacturing a light-emitting device by which the precision of patterning of an EL layer formed over a deposition substrate can be improved, and a film formation substrate used for the method.

One embodiment of the present invention is a method for manufacturing a light-emitting device including the steps of disposing one surface of a first substrate including a reflective layer including an opening, a light absorption layer formed over the reflective layer to cover the opening in the reflective layer, a protective layer formed over the light absorption layer and including a groove at a position overlapped with the opening in the reflective layer, and a material layer formed over the protective layer and a deposition surface of a second substrate to face each other, performing light irradiation from the other surface side of the first substrate, and forming an EL layer in a region overlapped with the opening in the reflective layer on the deposition surface of the second substrate.

In another embodiment of the present invention, the protective layer can include a groove formed at a position overlapped with the reflective layer.

Another embodiment of the present invention is a method for manufacturing a light-emitting device including the steps of disposing one surface of a first substrate including a reflective layer including an opening, a light absorption layer formed over the reflective layer to cover the opening in the reflective layer, a first protective layer formed over the light absorption layer and including an opening at a position overlapped with the opening in the reflective layer, a second protective layer formed over the first protective layer to cover the opening in the first protective layer, and a material layer formed over the second protective layer and a deposition surface of a second substrate to face each other, performing light irradiation from the other surface side of the first substrate, and forming an EL layer in a region overlapped with the opening in the reflective layer on the deposition surface of the second substrate.

In another embodiment of the present invention, the first protective layer can include a groove formed at a position overlapped with the reflective layer.

Another embodiment of the present invention is a method for manufacturing a light-emitting device including the steps of disposing one surface of a first substrate including a reflective layer including an opening, a heat insulating layer formed over the reflective layer and including an opening at a position overlapped with the opening in the reflective layer, a light absorption layer formed over the heat insulating layer to cover the opening in the reflective layer and the opening in the heat insulating layer, a protective layer formed over the light absorption layer, and a material layer formed over the protective layer and a deposition surface of a second substrate to face each other, performing light irradiation from the other surface side of the first substrate, and forming an EL layer in a region overlapped with the opening in the reflective layer and the opening in the heat insulating layer on the deposition surface of the second substrate.

In another embodiment of the present invention, the heat insulating layer can include a groove formed at a position overlapped with the reflective layer.

In still another embodiment of the present invention, it is possible that a first electrode is provided on the deposition surface of the second substrate and a second electrode is formed over the second substrate after heating the material layer of the first substrate to be deposited onto the first electrode of the second substrate.

Another embodiment of the present invention is a film formation substrate including a reflective layer including an opening and formed over a substrate, a light absorption layer formed over the reflective layer to cover the opening in the reflective layer, a protective layer formed over the light absorption layer and including a groove at a position overlapped with the opening in the reflective layer, and a material layer formed over the protective layer.

Another embodiment of the present invention is a film formation substrate including a reflective layer including an opening and formed over a substrate, a light absorption layer formed over the reflective layer to cover the opening in the reflective layer, a first protective layer formed over the light absorption layer and including an opening at a position overlapped with the opening in the reflective layer, a second protective layer formed over the first protective layer to cover the opening in the first protective layer, and a material layer formed over the second protective layer.

Another embodiment of the present invention is a film formation substrate including a reflective layer including an opening and formed over a substrate, a heat insulating layer formed over the reflective layer and including an opening at a position overlapped with the opening in the reflective layer, a light absorption layer formed over the heat insulating layer to cover the opening in the reflective layer and the opening in the heat insulating layer, a protective layer formed over the light absorption layer, and a material layer formed over the protective layer.

By application of an embodiment of the present invention, the precision of patterning of an EL layer formed over a deposition substrate can be improved.

BRIEF DESCRIPTION OF DRAWINGS

FIGS. 4A to 4C are cross-sectional views illustrating a method for manufacturing a film formation substrate according to a modification example.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the invention should not be construed as being limited to the description in the following embodiments.

Embodiment 1

FIGS. 1A to 1D and FIGS. 2A to 2D are cross-sectional views illustrating a method for manufacturing a film formation substrate according to an embodiment of the present invention. FIGS. 3A and 3B are cross-sectional views illustrating a method for manufacturing a light-emitting device using a film formation substrate illustrated in FIG. 2D.

Figure 1A:
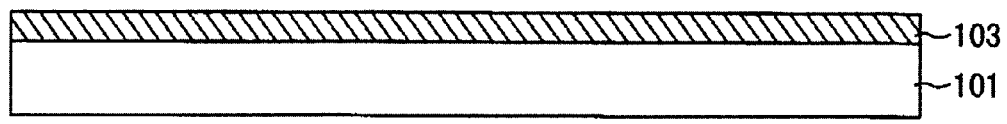
FIGS. 1A to 1D are cross-sectional views illustrating a method for manufacturing a film formation substrate according to an embodiment of the present invention.
Figure 1B:
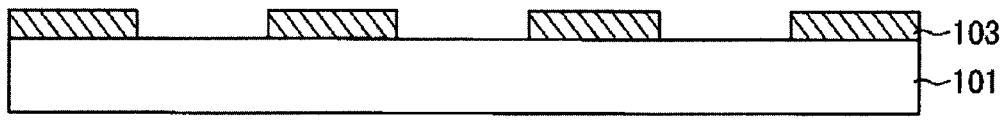

A reflection layer 103 is formed over a first substrate 101 as illustrated in FIG. 1A, and then an opening is formed in the reflective layer 103 as illustrated in FIG. 1B.

The first substrate 101 is the supporting substrate for the reflective layer, the light absorption layer, the heat insulating layer, and the like, and transmits irradiation light used for depositing the material layer onto a deposition substrate in a manufacturing process of a light-emitting device. Therefore, the first substrate 101 preferably has high light transmittance. Specifically, when lamp light or laser light is used in order to deposit the material layer, a substrate that transmits the light is preferably used as the first substrate 101. As the first substrate 101, for example, a glass substrate, a quartz substrate, a plastic substrate containing an inorganic material, or the like can be used.

In a manufacturing process of a light-emitting device, the reflective layer 103 reflects light with which the first substrate is irradiated to shield a portion of the material layer (denoted by reference numeral 109 in FIG. 2D), which is formed in a region overlapped with the reflective layer 103, so that heat that enables film formation is not conducted to this portion.

Note that in this specification, "overlapped with" means not only the case where components included in a film formation substrate (e.g., a reflective layer and a light absorption layer) are overlapped with each other while in direct contact with each other, but also the case where the components are overlapped with each other with another layer interposed therebetween.

The reflective layer 103 is preferably formed using a material having a high reflectance for the irradiation light, preferably a reflectance of 85% or more, more preferably a reflectance of 90% or more for the irradiation light. For example, when light in the infrared region at a wavelength of 800 nm to 2500 nm is irradiated, aluminum, silver, gold, platinum, copper, an alloy containing aluminum, an alloy containing silver, or the like can be used as a material of the reflective layer. In particular, an aluminum-titanium alloy, an aluminum-neodymium alloy, or a silver-neodymium alloy has high reflectance for light in the infrared region (at a wavelength of 800 nm or more) and is thus suitably used for the reflective layer. For example, in the case of having a thickness of 400 nm, an aluminum-titanium alloy film exhibits a reflectance of 85% or more for light throughout the infrared region (at a wavelength of greater than or equal to 800 nm and less than or equal to 2500 nm) and in particular, a reflectance of 90% or more for light in the region at a wavelength of greater than or equal to 900 nm and less than or equal to 2500 nm. Note that the kind of suitable material for the reflective layer 103 varies depending on the wavelength of light with which the first substrate 101 is irradiated. In addition, the reflective layer is not limited to a single layer and may include a plurality of layers.

Note that the reflective layer 103 can be formed by any of a variety of methods. For example, the reflective layer 103 can be formed by a sputtering method, an electron beam evaporation method, a vacuum evaporation method, or the like. In addition, the thickness of the reflective layer is preferably about greater than or equal to 100 nm and less than or equal to 2 μm, although it depends on a material. A thickness of greater than or equal to 100 nm can suppress transmission of irradiation light through the reflective layer.

In addition, although any of a variety of methods can be employed for forming the opening in the reflective layer 103, dry etching is preferably used. By the use of dry etching, the opening has a sharper sidewall, and thus a minute pattern can be formed.

In this embodiment, an aluminum film having a thickness of greater than or equal to 100 nm and less than or equal to 500 nm (preferably 150 nm) is formed as the reflective layer 103. In the case of having a thickness of greater than or equal to 100 nm and less than or equal to 500 nm, an aluminum film exhibits a reflectance of 85% or more throughout the infrared region (at a wavelength of greater than or equal to 800 nm and less than or equal to 2500 nm) and in particular, a reflectance of 90% or more for light in the region at a wavelength of greater than or equal to 900 nm and less than or equal to 2500 nm. In addition, an aluminum film having a thickness of greater than or equal to 100 nm and less than or equal to 500 nm has a transmittance of 0% for light in the infrared region (at a wavelength of greater than or equal to 800 nm and less than or equal to 2500 nm) and therefore can be preferably used for the reflective layer.

Figure 1C:
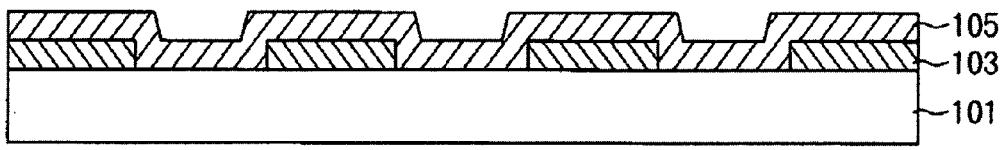

Next, as illustrated in FIG. 1C, a light absorption layer 105 is formed over the reflective layer 103 to cover the opening in the reflective layer 103.

In a manufacturing process of a light-emitting device, the light absorption layer 105 absorbs irradiation light for heating the material layer (denoted by reference numeral 109 in FIG. 2D) to convert the light to heat. Therefore, the light absorption layer 105 is formed at least over a region in which the material layer is heated and may have an island shape, for example. It is preferable that the light absorption layer 105 be formed using a material having a reflectance of 70% or less for irradiation light and having high absorptance. It is also preferable that the light absorption layer 105 be formed using a material having excellent heat resistance so that it does not change with heat. The kind of materials that is suitable for the light absorption layer 105 varies depending on the wavelength of the irradiation light for heating the material layer. For example, for light having a wavelength of 800 nm, molybdenum, tantalum nitride, titanium, tungsten, or the like is preferably used. Moreover, for light having a wavelength of 1300 nm, tantalum nitride, titanium, or the like is preferably used.

In addition, in the case of having a thickness of 400 nm, a molybdenum film and a tungsten film each have a reflectance of 60% or less for light at a wavelength of greater than or equal to 800 nm and less than or equal to 900 nm and therefore can be suitably used for the light absorption layer 105. Furthermore, a molybdenum film and a tungsten film each have a reflectance of 85% or more for light at a wavelength of greater than or equal to 2000 nm and less than or equal to 2500 nm and therefore can be used for the reflective layer.

Note that the light absorption layer 105 can be formed by a variety of methods. For example, by a sputtering method, the light absorption layer 105 can be formed using a target using molybdenum, tantalum, titanium, tungsten, or the like, or an alloy thereof. In addition, the light absorption layer is not limited to a single layer and may include a plurality of layers.

It is preferable that the light absorption layer have a thickness such that it does not transmit irradiation light. It is preferable that the thickness be in the range from 100 nm to 2 μm, although it depends on a material. In particular, the light absorption layer 105 having a thickness of greater than or equal to 200 nm and less than or equal to 600 nm can efficiently absorb the irradiation light to generate heat.

Note that the light absorption layer 105 may transmit part of the irradiation light as long as the film formation material contained in the material layer (denoted by reference numeral 109 in FIG. 2D) is heated to a film formation temperature. However, in the case where part of the irradiation light is transmitted, a material that does not decompose even when irradiated with light is preferably used for the material layer 109.

Note that the greater the difference in reflectance between the reflective layer 103 and the light absorption layer 105 is, the more preferable it is. Specifically, the difference in reflectance for the wavelength of the irradiation light is preferably greater than or equal to 25%, more preferably greater than or equal to 30%.

In this embodiment, a titanium film having a thickness of greater than or equal to 200 nm and less than or equal to 600 nm is formed as the light absorption layer 105. In the case of having a thickness of greater than or equal to 200 nm and less than or equal to 600 nm, a titanium film exhibits a reflectance of 67% or less for light throughout the infrared region at a wavelength of greater than or equal to 800 nm and less than or equal to 2500 nm. In particular, a titanium film exhibits a reflectance of 60% or less for light in the infrared region at a wavelength of greater than or equal to 800 nm and less than or equal to 1250 nm. In addition, a titanium film transmits almost no light in the region at a wavelength of greater than or equal to 300 nm and less than or equal to 2500 nm. Furthermore, a titanium film having a thickness of greater than or equal to 200 nm and less than or equal to 600 nm has an absorptance of 30% or more and thus can be suitably used for the light absorption layer.

Figure 1D:
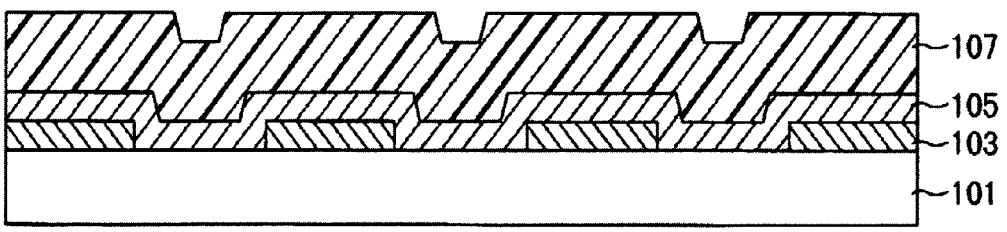

Next, a protective layer 107 is formed over the light absorption layer 105 as illustrated in FIG. 1D.

In a manufacturing process of a light-emitting device, the protective layer 107 suppresses deformation of the light absorption layer 105 due to heat. By provision of the protective layer 107, heating the portion of the material layer (denoted by reference numeral 109 in FIG. 2D), which is located in the region overlapped with the reflective layer 103, can be suppressed. For the protective layer 107, for example, titanium oxide, silicon oxide, silicon oxynitride, zirconium oxide, titanium carbide, silicon nitride, or silicon nitride oxide can be preferably used. Note that for the protective layer 107, a material having lower heat conductivity than materials used for the reflective layer 103 and the light absorption layer 105 is preferably used. Note that in this specification, oxynitride is a substance which contains more oxygen than nitrogen.

The protective layer 107 can be formed by any of a variety of methods. For example, the protective layer 107 can be formed by a sputtering method, an electron beam evaporation method, a vacuum evaporation method, a CVD method, or the like. In addition, the thickness of the protective layer 107 can be set to be greater than or equal to 10 nm and less than or equal to 2 μm, preferably, greater than or equal to 100 nm and less than or equal to 600 nm, although it depends on a material. By setting the thickness of the protective layer 107 to be greater than or equal to 10 nm and less than or equal to 2 μm, an effect of suppressing heat conduction to the portion of the material layer, which is located over the reflective layer 103, can be obtained even when the reflective layer 103 is heated.

Figure 2A:
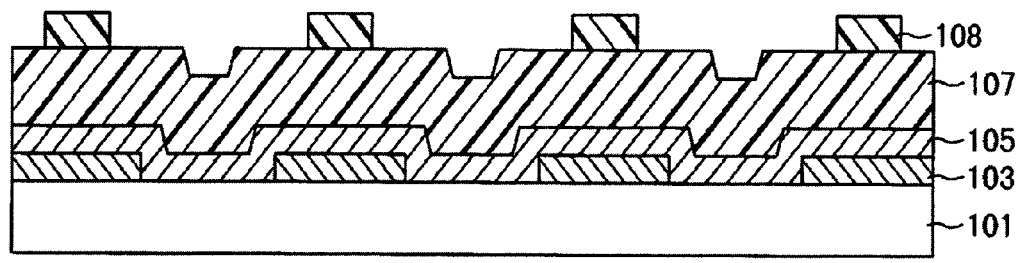
FIGS. 2A to 2D are cross-sectional views illustrating a method for manufacturing a film formation substrate according to an embodiment of the present invention.
Figure 2B:
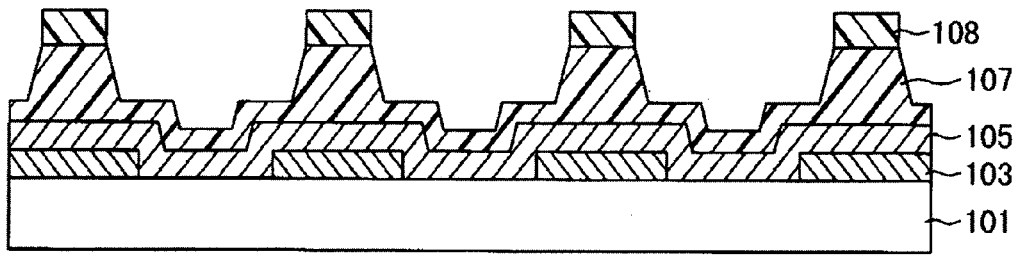
Figure 2C:
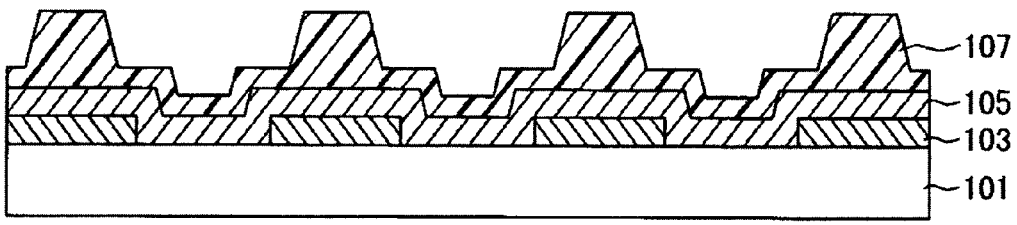
Figure 3A:
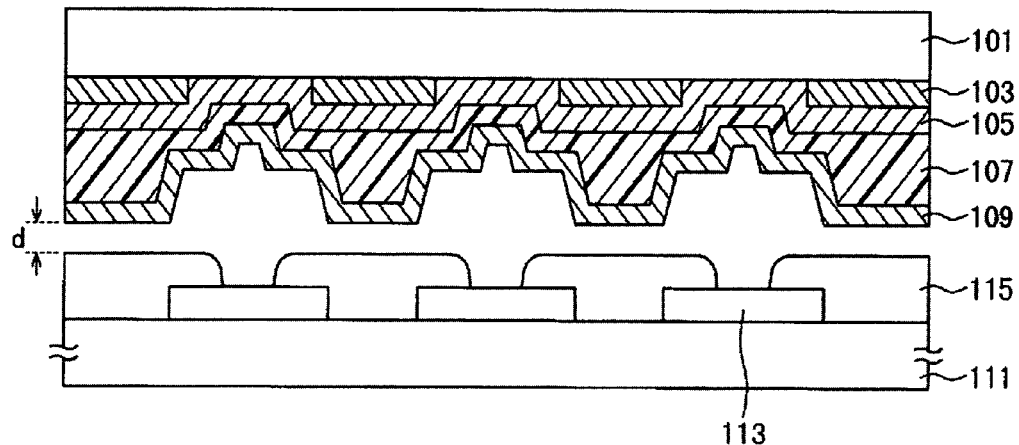
FIGS. 3A and 3B are cross-sectional views illustrating a method for manufacturing a light-emitting device according to an embodiment of the present invention.
Figure 3B:
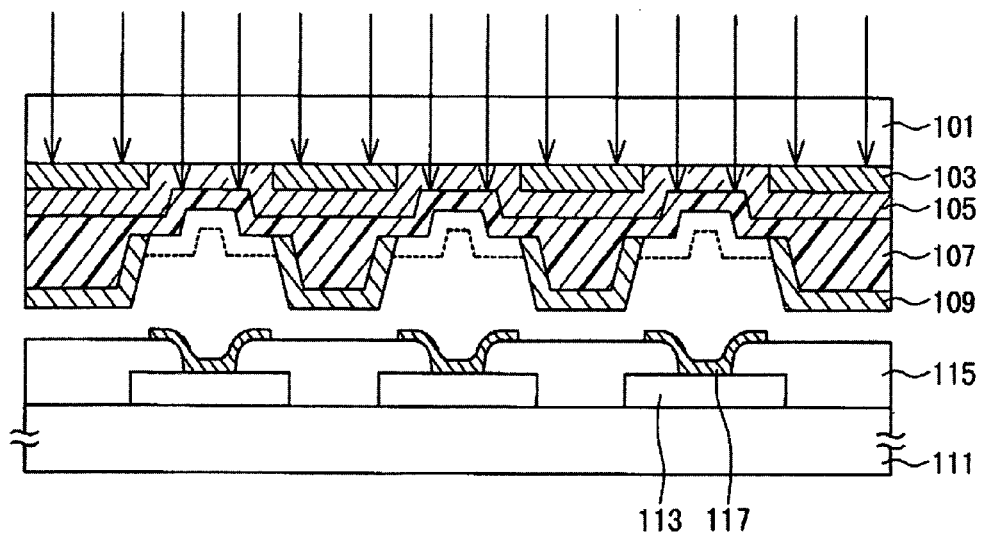

Next, as illustrated in FIG. 2A, a resist film is formed over the protective layer 107 and this resist film is exposed to light and developed, whereby a resist pattern 108 is formed over the protective layer 107. After that, half-etching is performed on the protective layer 107 using the resist pattern 108 as a mask, as illustrated in FIG. 2B. As illustrated in FIG. 2C, the resist pattern 108 is removed. Accordingly, a groove which is located in the region overlapped with the opening in the reflective layer 103 is formed in the protective layer 107, whereby the region of the protective layer 107 is thinned.

In this embodiment, a silicon oxide film is formed as the protective layer 107. The thickness of the portion of the protective layer 107, which is located in the region (pixel portion) overlapped with the opening in the reflective layer 103, is set to be 100 nm, and the thickness of the portion of the protective layer 107, which is located in the region (non-pixel portion) overlapped with the reflective layer 103, is set to be 600 nm. When the thickness of the portion of the protective layer 107, which is located in the region overlapped with the reflective layer 103, is increased, the portion of the protective layer can function as a spacer for controlling a distance between the film formation substrate and the deposition substrate. The sidewall of the protective layer 107 as the spacer has a taper shape.

Figure 2D:
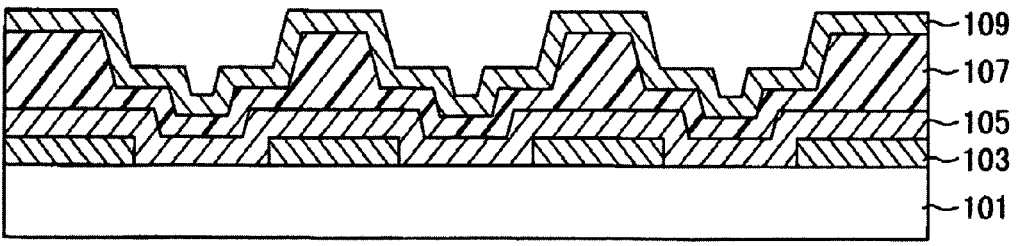

Next, the material layer 109 containing a film formation material is formed over the protective layer 107 as illustrated in FIG. 2D. The material layer 109 is transferred to a second substrate by being heated. As the film formation material, any of a variety of materials can be used. Further, the material layer 109 may contain plural kinds of film formation materials. Furthermore, the material layer 109 may be a single layer or a stack of a plurality of layers. By stacking a plurality of layers each containing a film formation material, co-deposition is possible. Note that it is preferable that a plurality of layers each containing a film formation material be stacked so as to contain a film formation material having a lower film formation temperature on the first substrate side. Such a structure makes it possible to efficiently heat a plurality of layers containing film formation materials for deposition. Note that in this specification, a "film formation temperature" is a temperature at which at least part of a film formation material is transferred from a film formation substrate to a deposition substrate by the action of heat.

The material layer 109 is formed by any of a variety of methods. For example, a dry method such as a vacuum evaporation method or a sputtering method can be used. Alternatively, a wet method such as a spin coating method, a spray coating method, an inkjet method, a dip coating method, a casting method, a die coating method, a roll coating method, a blade coating method, a bar coating method, a gravure coating method, or a printing method can be used. In order to form the material layer 109 by such a wet method, a desired film formation material may be dissolved or dispersed in a solvent, and a solution or a dispersion solution may be adjusted. There is no particular limitation on the solvent as long as it can dissolve or disperse the film formation material and it does not react with the film formation material. For example, as a solvent, any of the following can be used: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. Further, a mixture of plural kinds of those solvents may be used. The use of a wet process makes it possible to increase efficiency in the use of materials and reduce manufacturing cost of a light-emitting device.

Note that the thickness of an EL layer 117 formed, in a later step (a step of FIGS. 3A and 3B), over the second substrate 111 which is the deposition substrate depends on the material layer 109 formed over the first substrate 101 which is the supporting substrate. Therefore, by controlling the thickness of the material layer 109, the thickness of the EL layer 117 formed over the second substrate 111 which is the deposition substrate can be controlled easily. Note that the material layer does not necessarily need to be a uniform layer as long as the thickness and uniformity of the EL layer are ensured. For example, the material layer may be formed in a minute island shape or may have unevenness.

Note that a variety of materials can be used as the film formation material regardless of whether they are organic compounds, inorganic compounds, or organic compounds containing inorganic compounds. In particular, many organic compounds have lower film formation temperatures than inorganic compounds; thus, organic compounds can be easily deposited by light irradiation and are suitable for the method for manufacturing a light-emitting device according to this embodiment. Examples of organic compounds include a light-emitting material, a carrier transporting material, and the like used for a light-emitting device. Examples of inorganic compounds include a metal oxide, a metal nitride, a metal halide, an elemental metal, and the like used for a carrier transporting layer, a carrier injecting layer, an electrode, and the like of a light-emitting device.

Next, as illustrated in FIG. 3A, the second substrate 111 which is the deposition substrate is disposed to face the surface of the first substrate 101, where the reflective layer 103, the light absorption layer 105, the protective layer 107, and the material layer 109 are formed. The second substrate 111 is a deposition substrate over which a desired layer is to be formed by a film formation process.

The first substrate 101 and the second substrate 111 are disposed close to each other so as to face each other in proximity; specifically, they are disposed close to each other so that the distance d between the second substrate 111 and the surface of the film formation material contained in the layer provided over the first substrate 101 is greater than or equal to 0 mm and less than or equal to 2 mm, preferably, greater than or equal to 0.0 mm and less than or equal to 0.05 mm, more preferably, greater than or equal to 0 mm and less than or equal to 0.03 mm. By reducing the distance d to around the above range, the use efficiency of the film formation material can be improved. In addition, the precision of patterning of the EL layer 117 formed over the deposition substrate can be improved. Note that in the case where the surface of the deposition substrate is even, the distance d between the second substrate 111 which is the deposition substrate and the first substrate 101 which is the supporting substrate is preferably more than 0 mm.

Note that the distance d is defined as a distance between the surface of the material layer 109 formed over the supporting substrate and the surface of the deposition substrate. In addition, when some layer (such as a conductive layer that functions as an electrode or an insulating layer that functions as a partition) is formed over the deposition substrate, the distance d is defined as a distance between the surface of the material layer 109 over the supporting substrate and the surface of the layer formed over the deposition substrate. Note that when the surface of the material layer formed over the supporting substrate or the surface of the layer formed over the deposition substrate is uneven, the distance d is defined as the shortest distance between the surface of the material layer 109 over the supporting substrate and the outermost surface of the deposition substrate or the layer formed over the deposition substrate.

In order to improve the use efficiency of the material and also to improve the precision of patterning, although the distance between the first substrate and the second substrate is preferably short, this embodiment is not limited thereto.

In FIGS. 3A and 3B, the second substrate 111 is provided with a first electrode layer 113. An edge portion of the first electrode layer 113 is preferably covered with an insulator 115. In this embodiment, the first electrode layer represents an electrode to be an anode or a cathode of a light-emitting element.

After the first substrate 101 and the second substrate 111 are disposed, light irradiation is performed from the rear surface of the first substrate 101, that is, a surface opposite to the surface where the material layer is formed, as indicated by arrows in FIG. 3B. The irradiation light is reflected in the region where the reflective layer 103 is formed, and transmitted in the opening provided in the reflective layer 103 to be absorbed in a portion of the light absorption layer 105, which is located in the region overlapped with the opening. The absorbed light is converted to thermal energy, whereby a portion of the material layer 109, which is located in the region overlapped with the light absorption layer 105, is heated through the protective layer 107. The heated film formation material is deposited onto the first electrode layer, whereby the EL layer 117 is formed.

In this embodiment, by provision of the protective layer 107 over the light absorption layer 105, deformation of the light absorption layer 105 due to heat can be suppressed; thus, a film formation substrate can be used plural times. In addition, by provision of the protective layer 107 over the light absorption layer 105, a material forming the light absorption layer can be prevented from entering the EL layer. As a result, an adverse effect on characteristics of the light-emitting element which can be caused by the entry can be prevented.

Note that when the first substrate 101 is irradiated with light, heat generated in the light absorption layer 105 is conducted in the plane direction to heat the reflective layer 103 in some cases. In addition, even if the reflective layer 103 is formed using a material having a reflectance of 85% or more, a certain amount of heat is considered to be absorbed depending on the energy power of the irradiation light. However, in the film formation substrate according to this embodiment, since the protective layer 107 is provided between the reflective layer 103 and the material layer 109, conduction of heat to the material layer 109 can be suppressed by the protective layer 107 even when the reflective layer 103 is heated. Thus, by selectively heating the portion of the material layer 109, which is located in the region overlapped with the opening, the EL layer 117 having a desired pattern can be formed over the deposition substrate.

In addition, when the EL layer is formed over the deposition substrate, as described above, the distance d between the first substrate which is the film formation substrate and the second substrate which is the deposition substrate is preferably short. However, if a surface of the light absorption layer 105 that absorbs light to generate heat is too close to a surface of the second substrate 111, a deposition region of the second substrate is heated by radiant heat from the light absorption layer, whereby the formed EL layer is decomposed or crystallized in some cases. Therefore, the distance between the surface of the portion of the light absorption layer, which is located in the region overlapped with the opening, and the surface of the deposition region of the second substrate is preferably greater than or equal to 1 µm and less than or equal to 10 µm in the case where the distance d is less than or equal to 0.03 mm, for example, the outermost surface of the first substrate and the outermost surface of the second substrate is in contact with each other.

In the film formation substrate described in this embodiment, the protective layer 107 as a spacer is formed above the light absorption layer overlapped with the reflective layer, and by controlling the thickness of the protective layer, the distance between the light absorption layer and the surface of the deposition region of the second substrate can be controlled with the distance d between the first substrate and the second substrate kept short; thus, the precision of patterning of the EL layer can be improved.

As a light source used for the light irradiation, a variety of light sources can be used.

For example, a discharge lamp such as a xenon lamp or a metal halide lamp, or an exothermic lamp such as a halogen lamp or a tungsten lamp can be used as the light source. Alternatively, such a light source can be used as a flash lamp (e.g., a xenon flash lamp or a krypton flash lamp). Since a flash lamp is capable of emitting very high-intensity light repeatedly to a large area for a short time (0.1 msec to 10 msec), it can heat the substrate uniformly and efficiently regardless of the area of the first substrate. In addition, the flash lamp can control heating of the first substrate 101 by changing the length of emission time. Furthermore, the running cost can be suppressed because of a long life and low power consumption at the time of waiting for light emission of the flash lamp.

Alternatively, a laser device may be used as the light source. As the laser light, it is possible to use laser light emitted from, for example, a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tin, and Ta as a dopant; a glass laser; a ruby laser; an alexandrite laser; a Ti:sapphire laser; a copper vapor laser; a gold vapor laser; or a combination thereof. In addition, when a solid state laser whose laser medium is solid is used, the solid state laser has an advantage in that a maintenance-free condition can be kept for a long time and an advantage in that an output is relatively stable.

It is to be noted that as the light for irradiation, infrared light (a wavelength of 800 nm or more) is preferably used. With infrared light, the light absorption layer 105 can efficiently convert it to heat, and thus the film formation material can be efficiently heated.

In the method for manufacturing a light-emitting device according to this embodiment, since only a region of the material layer formed in the film formation substrate, which is overlapped with the opening in the reflective layer, is heated, the length of time for light irradiation may be relatively short compared to the case where an entire surface of the material layer is heated.

It is preferable that film formation be performed in a reduced-pressure atmosphere. The reduced-pressure atmosphere can be obtained by evacuation of the film formation chamber with a vacuum exhaust unit to a vacuum of about $5\times10^{-3}$ Pa or less, preferably, about $10^{-4}$ Pa to $10^{-6}$ Pa.

Note that although the case where the second substrate which is the deposition substrate is located below the first substrate which is the supporting substrate is illustrated in this embodiment, this embodiment is not limited to this structure. The orientations of the substrates can be set as appropriate.

In the film formation method according to this embodiment which is applied to a light-emitting device, by controlling the thicknesses of the material layers formed over the supporting substrate, the thickness of the EL layer formed over the deposition substrate by a film formation process can be controlled. In other words, the material layer formed over the supporting substrate may be formed as it is; thus, a film-thickness monitor is not needed. Therefore, a user does not need to adjust the film formation rate with a film-thickness monitor, and the film formation process can be fully automated. Accordingly, productivity can be increased.

In addition, by the film formation method according to this embodiment which is applied to a light-emitting device, when the material layer includes plural kinds of film formation materials, the EL layer including the same film formation materials at roughly the same weight ratio as the material layer can be formed over the deposition substrate. Accordingly, even in the case where plural kinds of film formation materials with different film formation temperatures are used for film formation, in the film formation method according to this embodiment, the film formation rate of each material does not need to be controlled unlike in co-deposition. Thus, without complicated control of the film formation rate or the like, a desired layer containing different kinds of film formation materials can be formed easily with high precision.

Application of this embodiment facilitates patterning of a light-emitting layer; thus, it also facilitates manufacture of a light-emitting device. Further, a minute pattern can be formed; thus, a high-definition light-emitting device can be obtained. Furthermore, application of this embodiment makes it possible to use, as a light source, a lamp heater or the like which is inexpensive but provides a large amount of heat can be used instead of a laser device. Moreover, by the use of a lamp heater or the like as a light source, film formation can be performed over a large area at a time; thus, cycle time can be shortened. Accordingly, manufacturing cost of a light-emitting device can be reduced.

Moreover, by the film formation method according to this embodiment, a desired film formation material can be deposited to the deposition substrate without being wasted. Thus, the use efficiency of a film formation material is increased, and reduction in cost can be achieved. In addition, a film formation material can be prevented from being attached to an inner wall of a film formation chamber, and maintenance of a deposition apparatus can be easier.

Accordingly, by application of this embodiment, it becomes easier to form a layer including desired different kinds of film formation materials and it becomes possible to improve productivity in manufacturing a light-emitting device or the like using the layer including different kinds of film formation materials.

Further, with the use of the film formation substrate according to this embodiment, a film formation material can be formed with high use efficiency, and costs can be reduced. In addition, with the use of the film formation substrate according to this embodiment, a film having a desired shape can be formed with high accuracy.

This embodiment can be combined with the other embodiment described in this specification, as appropriate.

FIGS. 4A to 4C are cross-sectional views illustrating a method for manufacturing a film formation substrate according to a modification example of this embodiment. The same portions as those in FIGS. 1A to 1D and FIGS. 2A to 2D are denoted by the same reference numerals and the description thereof is omitted.

After the reflective layer 103 is formed over the first substrate 101, the opening is formed in the reflective layer 103, as illustrated in FIG. 4A. Next, the light absorption layer 105 is formed over the reflective layer 103 to cover the opening in the reflective layer 103.

As illustrated in FIG. 4B, a first protective layer 107a as a spacer is formed over the light absorption layer 105 and an opening is formed in the first protective layer 107a. The opening in the first protective layer 107a is formed in the region overlapped with the opening in the reflective layer 103.

Then, as illustrated in FIG. 4C, a second protective layer 107b is formed over the first protective layer 107a to cover the opening in the first protective layer 107a.

The first and the second protective layers 107a and 107b can be formed using a material, a film formation method, a thickness, and a shape similar to those of the protective layer 107 of this embodiment. The thickness of the first protective layer 107a is preferably about 500 nm and the thickness of the second protective layer 107b is preferably about 100 nm.

In the modification example described above, an effect similar to that in this embodiment can be obtained.

Figure 5:
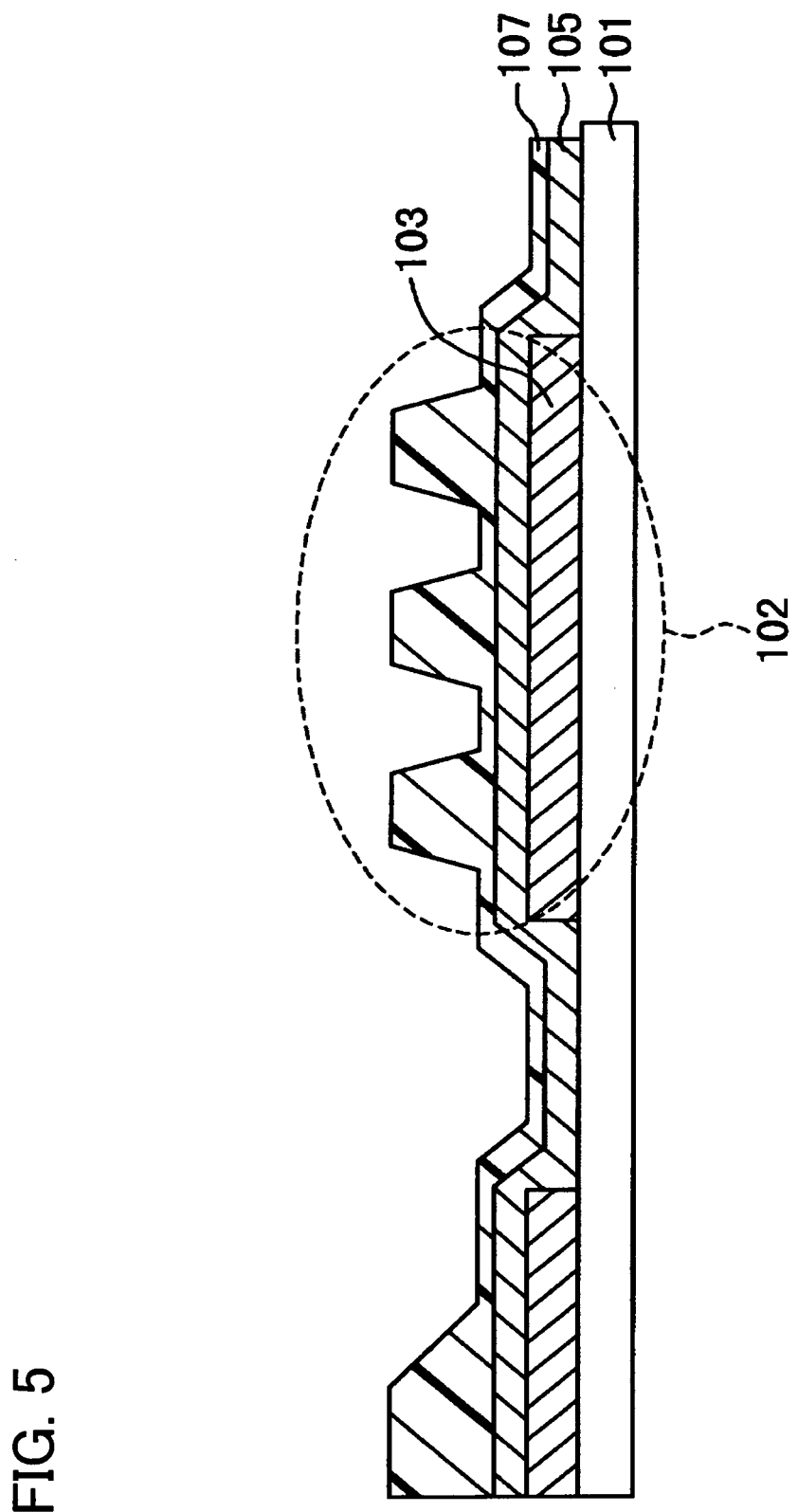
FIG. 5 is a cross-sectional view illustrating a method for manufacturing a film formation substrate according to another modification example.

FIG. 5 is a cross-sectional view corresponding to FIG. 2C for illustrating a method for manufacturing a film formation substrate according to another modification example of this embodiment. The same portions as those in FIGS. 1A to 1D and FIGS. 2A to 2D are denoted by the same reference numerals and the description thereof is omitted.

In the step illustrated in FIG. 2C, half etching is not performed on the non-pixel portion. In this modification example, as illustrated in FIG. 5, by performing a half etching on a non-pixel portion 102, a trench structure in which a groove is formed in the protective layer 107 as a spacer of the non-pixel portion 102 is employed. The number of grooves provided in the protective layer 107 of the non-pixel portion 102 may be one or more. When two or more grooves are provided, although the widths of the grooves do not necessarily need to be uniform, they are preferably uniform. Although half etching which is performed on the protective layer 107 of the non-pixel portion 102 is preferably performed at the time of half etching performed on the protective layer of the pixel portion, the half etching may be performed separately.

In the modification example described above, an effect similar to that in this embodiment can be obtained. Further, in the modification example described above, since the protective layer 107 as a spacer has a trench structure, a stress of the protective layer 107 can be dispersed and a warp of the substrate caused by the large thickness of the protective layer 107 of the non-pixel portion can be suppressed.

Embodiment 2

FIGS. 6A to 6D are cross-sectional views illustrating a method for manufacturing a film formation substrate according to an embodiment of the present invention. FIGS. 7A and 7B are cross-sectional views illustrating a method for manufacturing a light-emitting device using the film formation substrate illustrated in FIG. 6D. Note that in FIGS. 6A to 6D and FIGS. 7A and 7B, the same portions as those in FIGS. 1A to 1D, FIGS. 2A to 2D, FIGS. 3A and 3B, FIGS. 4A to 4C, and FIG. 5 are denoted by the same reference numerals and the description thereof is omitted.

Figure 6A:
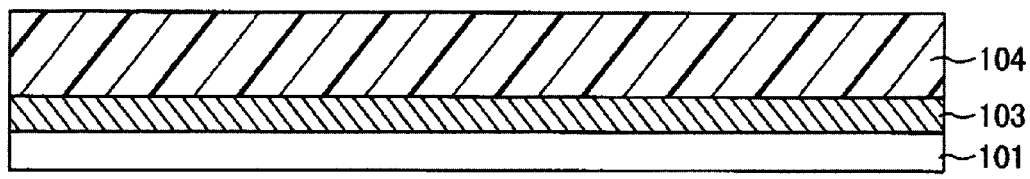
FIGS. 6A to 6D are cross-sectional views illustrating a method for manufacturing a film formation substrate according to an embodiment of the present invention.
Figure 7A:
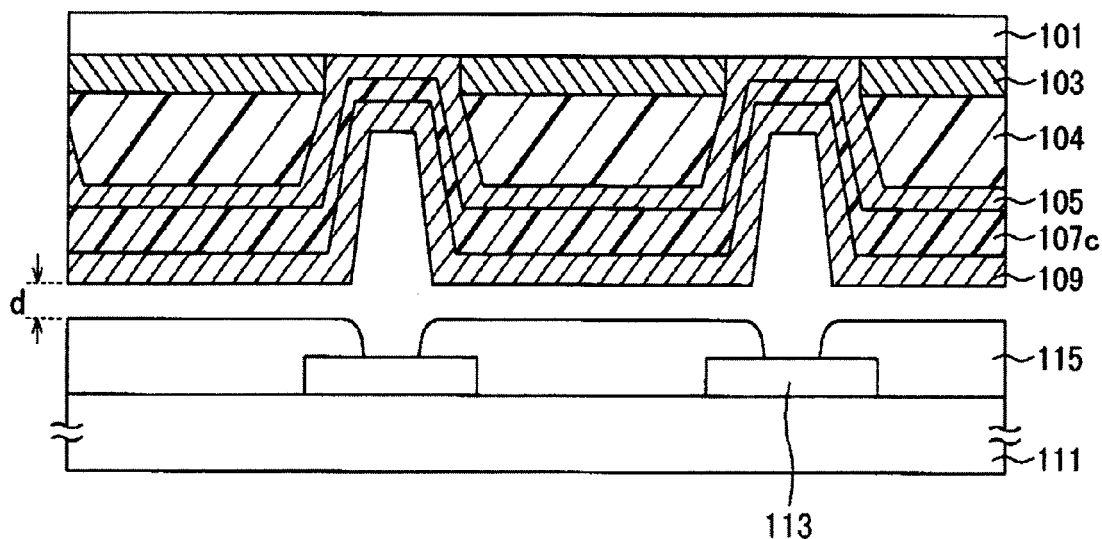
FIGS. 7A and 7B are cross-sectional views illustrating a method for manufacturing a light-emitting device according to an embodiment of the present invention.
Figure 7B:
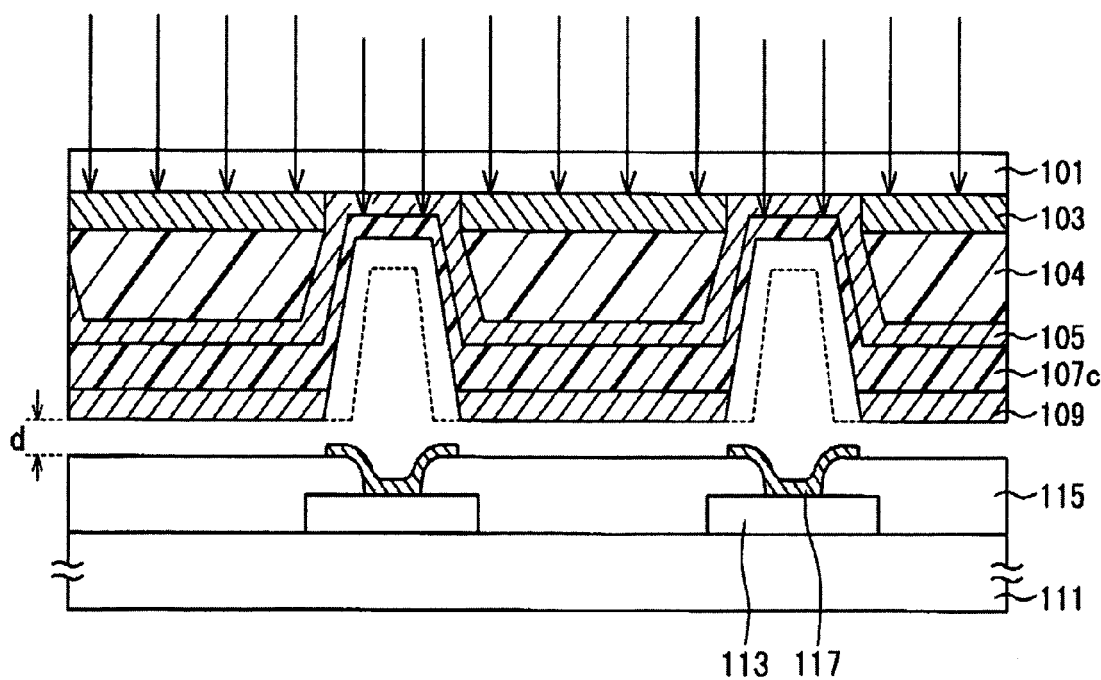

As illustrated in FIG. 6A, a reflective layer 103 is formed over a first substrate 101 and a heat insulating layer 104 is formed over the reflective layer 103.

Figure 6B:
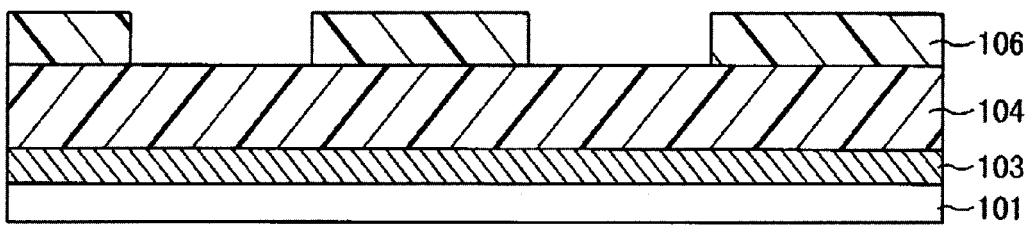

Next, as illustrated in FIG. 6B, a resist film is formed over the heat insulating layer 104 and this resist film is exposed to light and developed, so that a resist pattern 106 is formed over the heat insulating layer 104.

Figure 6C:
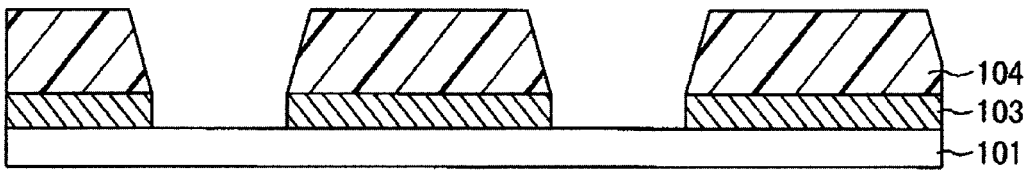

After that, as illustrated in FIG. 6C, the heat insulating layer 104 and the reflective layer 103 are etched using the resist pattern 106 as a mask and the resist pattern 106 is removed. In this manner, an opening is formed in the reflective layer 103 and the heat insulating layer 104.

In a manufacturing process of a light-emitting device, the heat insulating layer 104 suppresses heating of the portion of a material layer 109, which is located in the region overlapped with the reflective layer 103. For the heat insulating layer 104, for example, titanium oxide, silicon oxide, silicon oxynitride, zirconium oxide, titanium carbide, or the like can be preferably used. Note that for the heat insulating layer 104, a material having lower heat conductivity than materials used for the reflective layer 103 and a light absorption layer 105 is used.

The heat insulating layer 104 can be formed by any of a variety of methods. For example, the heat insulating layer 104 can be formed by a sputtering method, an electron beam evaporation method, a vacuum evaporation method, a CVD method, or the like. The thickness of the heat insulating layer can be in the range of greater than or equal to 10 nm to less than or equal to 2 μm, preferably greater than or equal to 100 nm to less than or equal to 600 nm, although it depends on a material. By setting the thickness of the heat insulating layer 104 to be greater than or equal to 10 nm and less than or equal to 2 μm, an effect of blocking heat conduction to the portion of the material layer, which is located over the reflective layer 103, can be obtained even when the reflective layer 103 is heated.

In addition, the heat insulating layer 104 includes the opening in the region overlapped with the opening in the reflective layer 103. Although any of a variety of methods can be employed for forming a pattern of the heat insulating layer 104 and the reflective layer 103, the use of dry etching is preferable. By the use of dry etching, the patterned heat insulating layer 104 has a sharper sidewall and thus a minute pattern can be formed.

Note that in this embodiment, the heat insulating layer 104 and the reflective layer 103 are patterned in one etching process, and accordingly the sidewalls of the openings in the heat insulating layer 104 and the reflective layer 103 can be aligned with each other, whereby a minute pattern can be formed; however, the heat insulating layer 104 and the reflective layer 103 may be patterned in different etching processes.

Figure 6D:
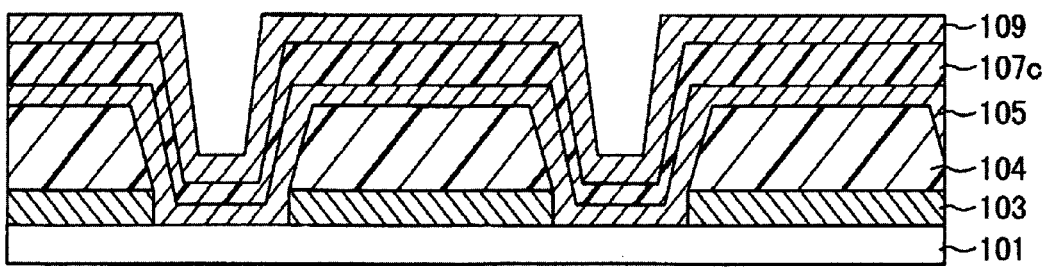

Next, the light absorption layer 105 is formed over the heat insulating layer 104 to cover the opening in the heat insulating layer 104 as illustrated in FIG. 6D. Then, a protective layer 107c is formed over the light absorption layer 105.

In a manufacturing process of a light-emitting device, the protective layer 107c suppresses deformation of the light absorption layer 105 due to heat. By provision of the protective layer 107c, heating the portion of the material layer 109, which is located in the region overlapped with the reflective layer 103, can be suppressed. For the protective layer 107c, for example, titanium oxide, silicon oxide, silicon oxynitride, zirconium oxide, titanium carbide, silicon nitride, or silicon nitride oxide can be preferably used. Note that for the protective layer 107c, a material having lower heat conductivity than materials used for the reflective layer 103 and the light absorption layer 105 is preferably used.

The protective layer 107c can be formed by any of a variety of methods. For example, the protective layer 107c can be formed by a sputtering method, an electron beam evaporation method, a vacuum evaporation method, a CVD method, or the like. The thickness of the protective layer 107c can be in the range of greater than or equal to 10 nm to less than or equal to 2 μm, preferably greater than or equal to 100 nm to less than or equal to 600 nm, although it depends on a material. By setting the thickness of the protective layer 107c to be greater than or equal to 10 nm and less than or equal to 2 μm, an effect of suppressing heat conduction to the portion of the material layer, which is located over the reflective layer 103, can be obtained even when the reflective layer 103 is heated.

Next, the material layer 109 containing the film formation material is formed over the protective layer 107c. The material layer 109 is transferred to a second substrate by being heated.

Then, as illustrated in FIG. 7A, a second substrate 111 is disposed to face the surface of the first substrate 101, where the reflective layer 103, the heat insulating layer 104, the light absorption layer 105, the protective layer 107c, and the material layer 109 are formed. The second substrate 111 is a deposition substrate over which a desired layer is to be formed by a film formation process.

In FIGS. 7A and 7B, the second substrate 111 is provided with a first electrode layer 113. An edge portion of the first electrode layer 113 is preferably covered with an insulator 115. In this embodiment, the first electrode layer represents an electrode to be an anode or a cathode of a light-emitting element.

After the first substrate 101 and the second substrate 111 are disposed, light irradiation is performed from the rear surface of the first substrate 101, that is, a surface opposite to the surface where the material layer is formed, as indicated by arrows in FIG. 7B. The irradiation light is reflected in the region where the reflective layer 103 is formed, and transmitted in the opening provided in the reflective layer 103 to be absorbed in a portion of the light absorption layer 105, which is located in the region overlapped with the opening. The absorbed light is converted to thermal energy, whereby a portion of the material layer 109, which is located in the region overlapped with the light absorption layer 105, is heated through the protective layer 107c. The heated film formation material is deposited onto the first electrode layer, whereby the EL layer 117 is formed.

In this embodiment, by provision of the protective layer 107c over the light absorption layer 105, deformation of the light absorption layer 105 due to heat can be suppressed; thus, a film formation substrate can be used plural times. In addition, by provision of the protective layer 107c over the light absorption layer 105, a material forming the light absorption layer can be prevented from entering the EL layer. As a result, an adverse effect on characteristics of the light-emitting element which can be caused by the entry can be prevented.

Note that when the first substrate 101 is irradiated with light, heat generated in the light absorption layer 105 is conducted in the plane direction to heat the reflective layer 103 in some cases. In addition, even if the reflective layer 103 is formed using a material having a reflectance of 85% or more, a certain amount of heat is considered to be absorbed depending on the energy power of the irradiation light. However, in the film formation substrate according to this embodiment, since the heat insulating layer 104 and the protective layer 107c each formed using a material having low heat conductivity are provided between the reflective layer 103 and the material layer 109, even when the reflective layer 103 is heated, conduction of heat to the material layer 109 can be blocked by the heat insulating layer 104 and the protective layer 107c. Thus, by selectively heating the portion of the material layer 109, which is located in the region overlapped with the opening, the EL layer 117 having a desired pattern can be formed over the deposition substrate.

In the film formation substrate described in this embodiment, the heat insulating layer 104 is formed under the light absorption layer 105, and by controlling the thickness of the heat insulating layer, the distance between the light absorption layer 105 and the surface of the deposition region of the second substrate 111 can be controlled with the distance d between the first substrate and the second substrate kept short; thus, the precision of patterning of the EL layer can be improved.

In the embodiment described with reference to FIGS. 6A to 6D and FIGS. 7A and 7B, an effect similar to that in the embodiment described with reference to FIGS. 1A to 1D, FIGS. 2A to 2D, FIGS. 3A and 3B, FIGS. 4A to 4C, and FIG. 5 can be obtained.

Figure 8A:
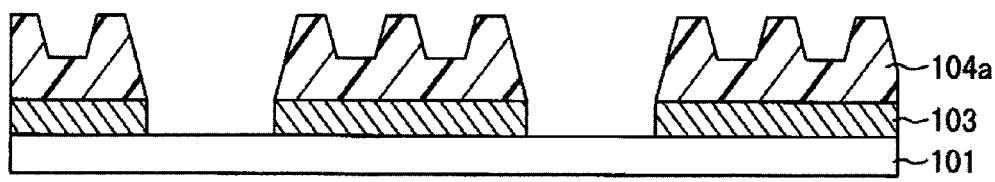
FIGS. 8A and 8B are cross-sectional views illustrating a method for manufacturing a film formation substrate according to a modification example.
Figure 8B:
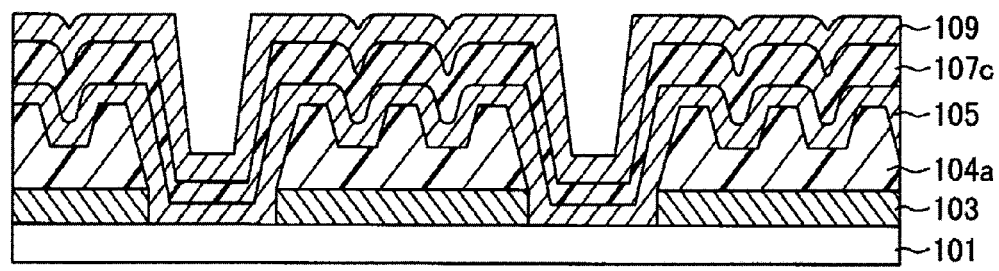

FIGS. 8A and 8B are cross-sectional views for describing a method for manufacturing a film formation substrate according to a modification example of this embodiment and are cross-sectional views corresponding to FIGS. 6C and 6D, respectively. The same portions as those in FIGS. 6A to 6D and FIGS. 7A and 7B are denoted by the same reference numerals and the description thereof is omitted.

In the step illustrated in FIG. 6C, a groove is not formed in the heat insulating layer 104 of the non-pixel portion. In this modification example, as illustrated in FIG. 8A, a trench structure in which a groove is formed in a heat insulating layer 104a of the non-pixel portion is employed. The number of grooves provided in the heat insulating layer 104a of the non-pixel portion may be one or more. When two or more grooves are provided, although the widths of the grooves may not be uniform, they are preferably uniform. Further, it is preferable that a groove is formed in the heat insulating layer 104a by half etching.

In the step illustrated in FIG. 8B, the light absorption layer 105 is formed over an opening and the heat insulating layer 104a having a trench structure, the protective layer 107c is formed over the light absorption layer 105, and the material layer 109 containing a film formation material is formed over the protective layer 107c.

Also in the modification example described above, an effect similar to that in this embodiment can be obtained. Further, in the modification example described above, since the heat insulating layer 104a has a trench structure, a stress of the heat insulating layer 104a can be dispersed and a warp of the substrate caused by the large thickness of the heat insulating layer 104a of the non-pixel portion can be suppressed.

Note that this embodiment can be combined with the other embodiment described in this specification, as appropriate.

This application is based on Japanese Patent Application Serial No. 2009-103896 filed with Japan Patent Office on Apr. 22, 2009, the entire contents of which are hereby incorporated by reference.

REFERENCE NUMERALS

101: first substrate, 102: non-pixel portion, 103: reflective layer, 104: heat insulating layer, 104a: heat insulating layer, 105: light absorption layer, 106: resist pattern, 107: protective layer, 107a: first protective layer, 107b: second protective layer, 107c: protective layer, 108: resist pattern, 109: material layer, 111: second substrate, 113: electrode layer, 115: insulator, and 117: EL layer.

The invention claimed is:

1. A method for manufacturing a light-emitting device, comprising the steps of:
disposing a first substrate and a second substrate so that one surface of the first substrate faces a deposition surface of the second substrate, wherein the first substrate includes a reflective layer including an opening, a light absorption layer covering the opening in the reflective layer over the reflective layer, a protective layer including a trench portion in a position overlapped with the opening in the reflective layer over the light absorption layer, and a material layer including a light-emitting material over the protective layer; and
forming an EL layer including the light-emitting material in a region overlapped with the opening in the reflective layer on the deposition surface of the second substrate by performing light irradiation from the other surface side of the first substrate,
wherein the protective layer has a lower heat conductivity than the reflective layer and the light absorption layer,
wherein the protective layer has a first region which is overlapped with the reflective layer and a second region which is not overlapped with the reflective layer, and
wherein the first region is thicker than the second region.

2. The method for manufacturing a light-emitting device according to claim 1, wherein the protective layer includes a trench formed in a position overlapped with the reflective layer.

3. The method for manufacturing a light-emitting device according to claim 1, wherein the deposition surface of the second substrate is provided with a first electrode.

4. A method for manufacturing a light-emitting device, comprising the steps of:

disposing a first substrate and a second substrate so that one surface of the first substrate faces a deposition surface of the second substrate, wherein the first substrate includes a reflective layer including an opening, a light absorption layer covering the opening in the reflective layer over the reflective layer, a first protective layer including an opening in a position overlapped with the opening in the reflective layer over the light absorption layer, a second protective layer covering the opening in the first protective layer over the first protective layer, and a material layer including a light-emitting material over the second protective layer; and forming an EL layer including the light-emitting material in a region overlapped with the opening in the reflective layer on the deposition surface of the second substrate by performing light irradiation from the other surface side of the first substrate, wherein the first and second protective layers have a lower heat conductivity than the reflective layer and the light absorption layer, wherein each of the first and second protective layers has a first region which is overlapped with the reflective layer and the second protective layer has a second region which is not overlapped with the reflective layer, and wherein the first region of the first protective layer is thicker than the second region of the second protective layer.

5. The method for manufacturing a light-emitting device according to claim 4, wherein the first protective layer includes a trench formed in a position overlapped with the reflective layer.

6. The method for manufacturing a light-emitting device according to claim 4, wherein the deposition surface of the second substrate is provided with a first electrode.

7. A method for manufacturing a light-emitting device, comprising the steps of:

disposing a first substrate and a second substrate so that one surface of the first substrate faces a deposition surface of the second substrate, wherein the first substrate includes a reflective layer including an opening, a heat insulating layer including an opening in a position overlapped with the opening in the reflective layer over the reflective layer, a light absorption layer covering the opening in the reflective layer and the opening in the heat insulating layer over the heat insulating layer, a protective layer over the light absorption layer, and a material layer including a light-emitting material over the protective layer; and forming an EL layer including the light-emitting material in a region overlapped with the opening in the reflective layer and the opening in the heat insulating layer on the deposition surface of the second substrate by performing light irradiation from the other surface side of the first substrate, wherein the protective layer has a lower heat conductivity than the reflective layer and the light absorption layer, wherein the protective layer has a first region which is overlapped with the reflective layer and a second region which is not overlapped with the reflective layer, and wherein the first region is thicker than the second region.

8. The method for manufacturing a light-emitting device according to claim 7, wherein the heat insulating layer includes a trench formed in a position overlapped with the reflective layer.

9. The method for manufacturing a light-emitting device according to claim 7, wherein the deposition surface of the second substrate is provided with a first electrode.

* * * * *

UNITED STATES PATENT AND TRADEMARK OFFICE
CERTIFICATE OF CORRECTION

PATENT NO.         : 8,618,568 B2  
APPLICATION NO.    : 13/259378  
DATED              : December 31, 2013  
INVENTOR(S)        : Tomoya Aoyama et al.

It is certified that error appears in the above-identified patent and that said Letters Patent is hereby corrected as shown below:

On the Title Page of Patent:

Item (73) Assignee;   Change "Semiconductor Energy Laboratory Co., Ltd. (JP)" to
--Semiconductor Energy Laboratory Co., Ltd. (JP) and Sharp Kabushiki Kaisha (JP)--.

Signed and Sealed this  
Fifth Day of August, 2014

Michelle K. Lee  
*Deputy Director of the United States Patent and Trademark Office*